United States Patent [19]

Legrand et al.

[11] 4,246,626
[45] Jan. 20, 1981

[54] MECHANICAL PROTECTION OF ELECTRICAL CONNECTORS OF ELECTRONIC POWER ASSEMBLIES COOLED BY A FLUORINATED HYDROCARBON

[75] Inventors: Bernard Legrand, Villiers St. Frederic; Michel Masselin, Velizy Villacoublay, both of France

[73] Assignee: Alsthom-Atlantique, Paris, France

[21] Appl. No.: 18,100

[22] Filed: Mar. 6, 1979

[51] Int. Cl.$^3$ .............................................. H05K 7/20
[52] U.S. Cl. .................................. 361/385; 361/379; 361/391
[58] Field of Search ............... 200/289; 174/15 R; 339/112 R, 112 L, 94 R, 94 M, 75 R, 75 M; 361/331, 332, 338, 379, 385, 391, 381, 382, 386; 363/141, 146

[56] References Cited

U.S. PATENT DOCUMENTS

| | | | |
|---|---|---|---|
| 3,575,482 | 4/1971 | MacMaster | 361/391 |
| 3,678,441 | 7/1972 | Upstone | 361/94 R |
| 3,717,805 | 2/1973 | Graedinger | 361/338 |
| 3,955,871 | 5/1976 | Kruger | 339/94 R |
| 3,976,352 | 8/1976 | Spinner | 339/94 R |
| 4,053,724 | 10/1977 | Llona | 361/331 |

Primary Examiner—Gerald P. Tolin
Attorney, Agent, or Firm—Sughrue, Rothwell, Mion, Zinn and Macpeak

[57] ABSTRACT

A device for protecting the connectors of an electronic power assembly disposed in an enclosure which contains a fluorinated hydrocarbon. The connectors are isolated by connecting them to a sealed terminal box through a chamber between the enclosure cover and the terminal box sealed by means of a seal.

Applications: Electric equipment in the railway and highway field.

1 Claim, 3 Drawing Figures

MECHANICAL PROTECTION OF ELECTRICAL CONNECTORS OF ELECTRONIC POWER ASSEMBLIES COOLED BY A FLUORINATED HYDROCARBON

FIELD OF THE INVENTION

The present invention relates to a mechanical protective device for electrical connectors of electronic power assemblies cooled by a fluorinated hydrocarbon, and in particular to devices disposed on railway or highway equipment.

BACKGROUND OF THE INVENTION

It is known that enclosures which contain a fluorinated hydrocarbon for cooling power semiconductors and their accessories disposed inside the enclosures have external connectors on the cover of the chamber. Up till now, these electric connectors exposed to the atmosphere either on the roof of the vehicle or under its body were subjected to all atmospheric disturbances—rain, snow or dust. The disadvantage of this disposition is that in these conditions, it sets up electric sparking between the connectors and electrical ground.

The device in accordance with the present invention remedies this drawback. Indeed, it provides increased protection and allows the assembly to be cleaned with a water jet without danger of short-circuits.

BRIEF SUMMARY OF THE INVENTION

The present invention provides a sealed mechanical protection device for electrical connectors of electronic power assemblies cooled by a fluorinated hydrocarbon, said assemblies being contained in a sealed enclosure and said connectors being disposed on a cover of said enclosure, wherein said cover is integrated with an insulating plate of a sealed terminal box, said connectors being enclosed in a sealed chamber provided between said insulating plate and said cover.

DRAWINGS

An embodiment of the present invention will be described hereinbelow by way of example with reference to the accompanying FIGS. 1 to 3. The same components illustrated in several of these figures bear the same reference symbols in all of them.

DESCRIPTION

Figure 1:
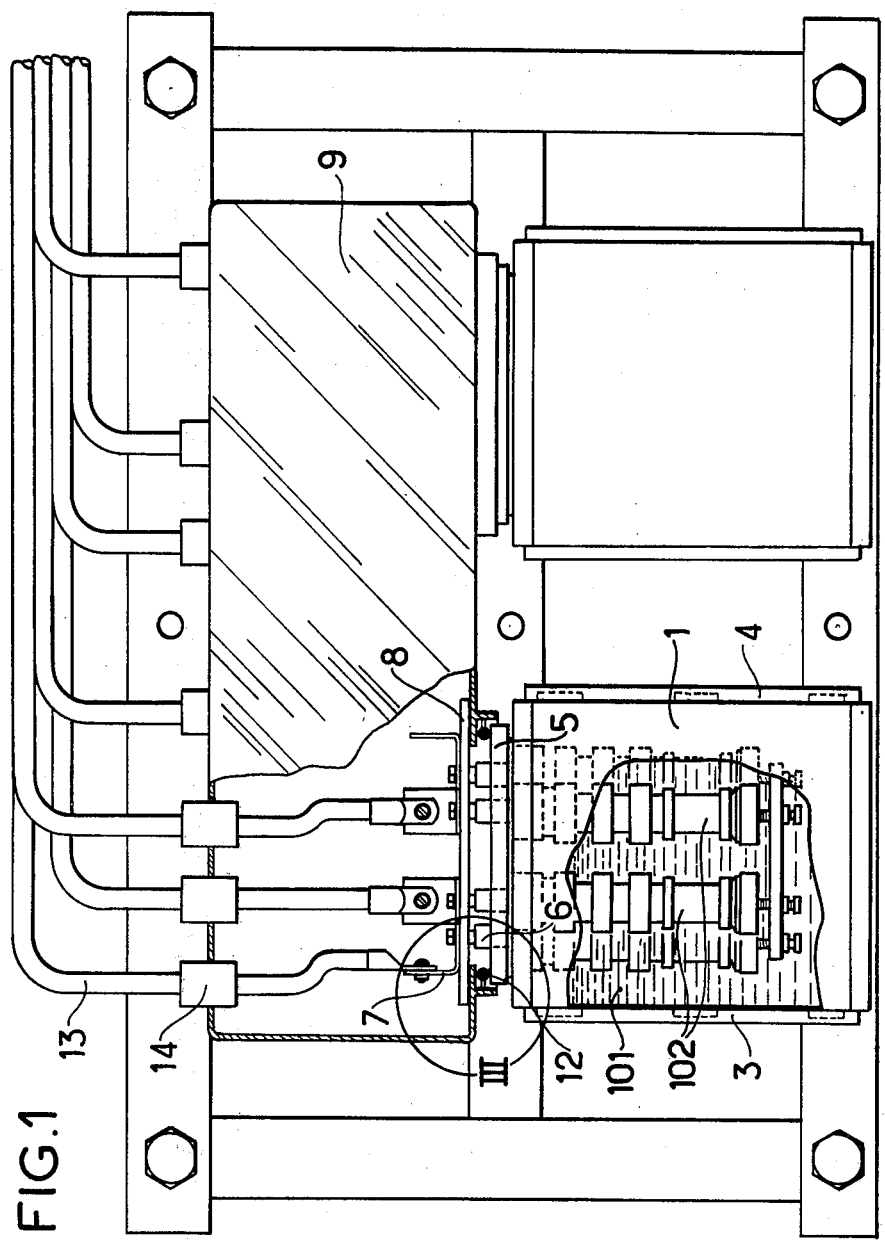
FIG. 1 is a partially cutaway plan of two chambers plugged onto a terminal box, together with their supports.
Figure 2:
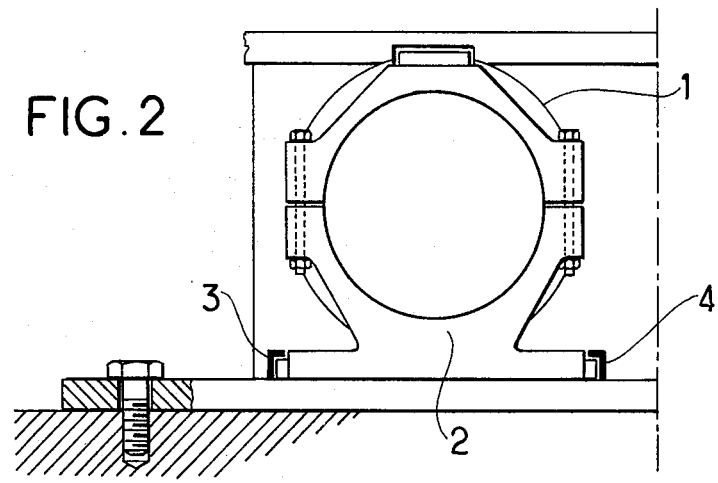
FIG. 2 is a partial side view of the same device.

As shown in FIGS. 1 and 2, at least one enclosure 1 which contains the electronic power assemblies 102 such as a power chopper, a rectifier bridge, a converter or an inverter immersed in a fluorinated hydrocarbon 101, is supported by a support 2 whose base can slide in rails 3 and 4. A cover 5 of the enclosure 1 is made of insulating material and includes connectors such as 6 whose function is to convey the various types of current (alternating current, direct current, pulsed current) towards the electronic assemblies 102 or coming therefrom. The connectors such as 6 are connected to terminals such as 7 disposed on an insulating plate which is a part of a sealed terminal box 9.

Figure 3:
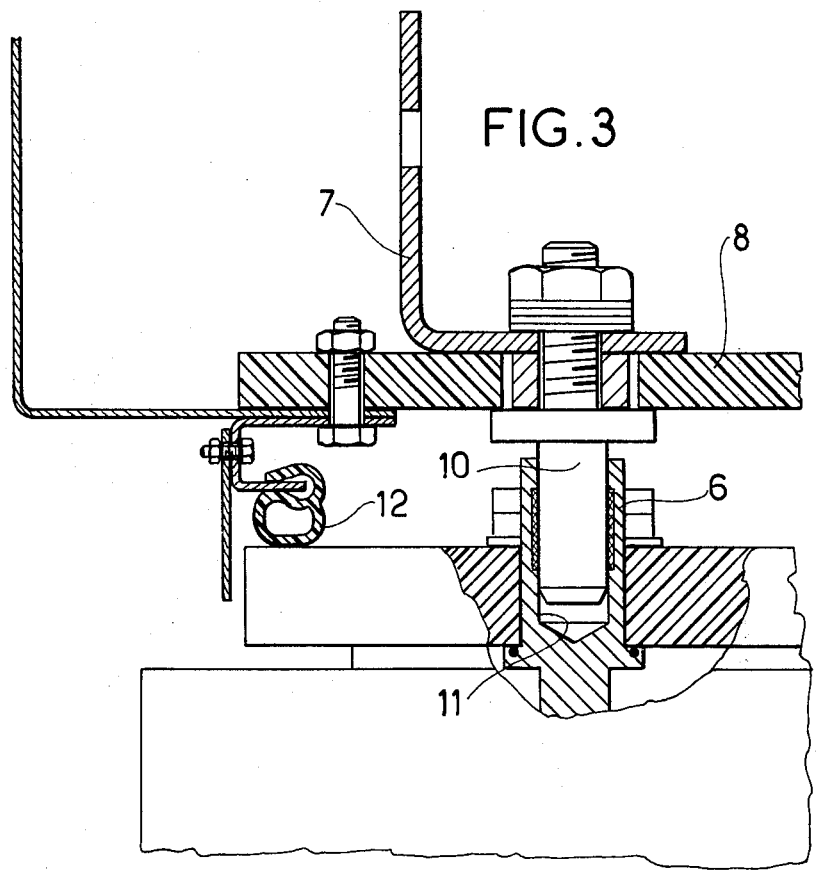
FIG. 3 is an enlarged view along III in FIG. 1.

Advantageously, in accordance with the detail of FIGS. 3, the terminal 7 has a male portion 10 which enters a female portion 11 of the connector 6. This is done by sliding the assembly formed by the enclosure 1 and its support 2 along the rails 3 and 4 and by then making the enclosure 1 integral with the plate 8, e.g. by means of screws. The plate 8 and the cover 5 constitute a chamber which is sealed by a seal 12 which may be circular.

Insulated cables such as 13 which pass through a wall of the terminal box 9 via a stuffing box 14 are connected to the terminals 7 inside the terminal box 9.

The mechanical protection device of the connector 6 seals the current inputs and outputs completely.

The advantages of the circuitry in accordance with the invention are as follows: complete protection of the electronic equipment, rapid interchangeability of an enclosure, absence of ventilation and air conditioning accessories, great reduction of the noise level.

Applications of the device come within the field of electric equipment for railways or highways.

We claim:

1. In combination, an enclosure bearing electronic power assemblies and fluorinated hydrocarbon for cooling said power assemblies internal of said enclosure, a support underlying said enclosure and bearing guide rails, said enclosure being positioned within said guide rails and movable with respect to said support, a cover overlying one end of said enclosure, multiple electrical connectors, each of said connectors including a female portion passing through said cover, a terminal box including a fixed insulating plate facing said cover and being spaced therefrom, said electrical connectors including a male portion passing through said fixed insulating plate, said female and male portions of said connectors being removably plugged together, and an annular seal ring secured to said fixed insulating plate, surrounding said plurality of electrical connectors and forming with said cover and said fixed insulating plate a sealed mechanical protection chamber.

* * * * *